(12) United States Patent  (10) Patent No.: US 9,509,128 B2
Anami  (45) Date of Patent: Nov. 29, 2016

(54) ELECTRICAL JUNCTION BOX

(71) Applicant: SUMITOMO WIRING SYSTEMS, LTD., Yokkaichi, Mie (JP)

(72) Inventor: Shuichi Anami, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/431,659

(22) PCT Filed: Sep. 24, 2013

(86) PCT No.: PCT/JP2013/075746
§ 371 (c)(1),
(2) Date: Mar. 26, 2015

(87) PCT Pub. No.: WO2014/054466
PCT Pub. Date: Apr. 10, 2014

(65) Prior Publication Data

US 2015/0280409 A1  Oct. 1, 2015

(30) Foreign Application Priority Data

Oct. 4, 2012 (JP) ................. 2012-222263

(51) Int. Cl.
*H02G 3/14* (2006.01)
*H02G 3/08* (2006.01)
*H05K 5/00* (2006.01)
*H02G 3/16* (2006.01)
*B60R 16/023* (2006.01)

(52) U.S. Cl.
CPC .............. *H02G 3/088* (2013.01); *H02G 3/14* (2013.01); *H02G 3/16* (2013.01); *H05K 5/0039* (2013.01); *B60R 16/0238* (2013.01); *H02G 3/081* (2013.01)

(58) Field of Classification Search
CPC ....................................................... H02G 3/088
USPC ......................................................... 174/560
See application file for complete search history.

(56) References Cited

U.S. PATENT DOCUMENTS 4,873,600 A * 10/1989 Vogele ..................... H02B 1/50
 174/50
2009/0298310 A1* 12/2009 Nakanishi .............. H02G 3/088
 439/76.2

FOREIGN PATENT DOCUMENTS

| JP | S58131119 U | 9/1983 |
| JP | S6359380 U | 4/1988 |
| JP | 2002058128 A | 2/2002 |
| JP | 2012100476 A | 5/2012 |

OTHER PUBLICATIONS

Oct. 29, 2013 International Search Report issued in International Application No. PCT/JP2013/075746.

* cited by examiner

*Primary Examiner* — Hung V Ngo
(74) *Attorney, Agent, or Firm* — Oliff PLC

(57) ABSTRACT

An electrical connection box has a main body portion including an internal circuit, and a cover having a box shape open downward and externally fitted from above to the main body portion. The cover has a peripheral wall with an end surface arranged to abut against a flange portion of the main body portion. The flange portion projects outward in a collar shape from a side wall of the main body portion. A surface of the flange portion of the main body portion and the end surface of the peripheral wall of the cover are inclined diagonally downward at the same inclination angle.

9 Claims, 6 Drawing Sheets

ELECTRICAL JUNCTION BOX

BACKGROUND

This application is a national stage application of PCT/IP2013/075746, international filing date Sep. 24, 2013, and claims priority to JP 2012-222263, filed in Japan on Oct. 4, 2012, the entire disclosures of which are hereby incorporated by reference in their entirety.

The present invention relates to an electrical connection box in which a box-shaped cover that is open downward is externally fitted from above to a main body portion including an internal circuit.

Conventionally, electrical connection boxes in which electrical components such as fuses and relays are arranged with good space efficiency are used at appropriate portions in electrical systems of automobiles and the like, and thus power supply/distribution from a battery to various electrical equipment and control thereof are efficiently performed. For example, JP 2012-100476A discloses a known example of such an electrical connection box, which has a structure in which a box-shaped cover that is open downward is externally fitted from above to a main body portion including an internal circuit configured by a printed circuit board and the like.

Incidentally, in such an electrical connection box, as shown in FIG. 5 in JP 2012-100476A, flange portions projecting outward in a collar shape are provided on side walls of the main body portion. The end surfaces of the peripheral walls of the cover that is externally fitted from above to the main body portion abut against the flange portions, and thus the cover is positioned with respect to the main body portion and held. Moreover, open gaps that are formed between the opposing surfaces of the peripheral walls of the cover and the side walls of the main body portion are covered with the flange portions from below, thus advantageously preventing water from entering the main body portion from below.

However, since the flange portions are formed to project outward in the direction orthogonal to the side walls of the main body portion, there is a problem in that, for example, when water attaching to the surface of the cover due to water splash or the like flows from the upper side to the lower side, the water is likely to accumulate on the flange portions before falling downward. In addition, since minute opposing gaps are formed between the flange portions and the end surfaces of the peripheral walls of the cover abutting against the flange portions from above as shown in FIG. 1 in JP 2012-100476A, there is a risk that water accumulating on the flange portions is led into the inside of the cover through the minute gaps by capillary action.

Moreover, it is thought that water enters the cover through fuse attaching portions and the like that are formed as openings in the upper surface of the cover, and there is a risk that water entering the cover accumulates in the opposing gaps between the flange portions and the end surfaces of the peripheral walls of the cover, and thus drainage to the outside is not promoted.

SUMMARY

Preferred embodiments were achieved in light of the above-described circumstances, and it is an object thereof to provide an electrical connection box with a novel structure, in which a cover having, for example, a box shape open downward is externally fitted from above to a main body portion including an internal circuit, and drainage capability and water resistance at opposing gaps between flange portions provided on the main body portion and the end surfaces of the peripheral walls of the cover are enhanced.

A first aspect of a preferred embodiment has an electrical connection box comprising a main body portion including an internal circuit, and a cover having a box shape that is open downward and is externally fitted from above to the main body portion. The cover has a peripheral wall with an end surface arranged to abut against a flange portion of the main body portion. The flange portion projects outward in a collar shape from a side wall of the main body portion. A surface of the flange portion of the main body portion and the end surface of the peripheral wall of the cover are inclined diagonally downward at the same inclination angle.

In the first preferred aspect, the surfaces of the flange portions and the end surfaces of the peripheral walls of the cover that abut against each other may be inclined diagonally downward at the same inclination angle, and therefore, it is possible to advantageously lead water that tends to accumulate on the surfaces of the flange portions to the lower side white ensuring sufficient contact areas between the surfaces of the flange portions and the end surfaces of the peripheral walls of the cover and maintaining the ability to position and hold the main body portion and the cover. This makes it possible to enhance drainage capability at the opposing gaps between the surfaces of the flange portions and the end surfaces of the peripheral walls of the cover.

In addition, the minute gaps that are formed between the opposing surfaces of the flange portions and the end surfaces of the peripheral walls of the cover may also be inclined diagonally downward, and therefore, water is not likely to be drawn up to the inside of the cover by capillary action. This makes it possible to also enhance water resistance at the opposing gaps between the surfaces of the flange portions and the end surfaces of the peripheral walls of the cover. Moreover, the drainage of water entering the cover to the outside through the opposing gaps, which are inclined diagonally downward, between the flange portions and the end surfaces of the peripheral walls of the cover is promoted.

Here, the main body portion may have any configuration as long as it includes an internal circuit and a cover is externally fitted thereto from above. The main body portion may, for instance, be configured by a single frame body tor accommodating the internal circuit or by a frame body to which a cover for covering the lower side of the frame body is attached on the lower side. Moreover, the flange portions provided on the main body portion may be formed on the frame body or on the cover on the lower side.

In a second aspect of fee preferred embodiment, the flange portion, is provided with a recessed portion that is formed by a downward recessed portion of the surface of the flange portion and is formed in a projecting end surface of the flange portion, and a bottom surface of the recessed portion is inclined diagonally downward.

With this aspect, the recessed portions may be provided in portions of the flange portions, and thus the opposing gaps between the surfaces of the flange portions and the end surfaces of the peripheral walls of the cover are made larger at the positions where the recessed portions are formed. Accordingly, if water is led to the minute gaps between the flange portions and the end surfaces of the peripheral walls of the cover by capillary action, surface tension is broken at the positions where the recessed portions are formed, and therefore, the water is led to the recessed portions and is rapidly drained to the outside. In addition, since the bottom surfaces of the recessed portions may be inclined diagonally downward, the water led to the recessed portions does not accumulate in the recessed portions and is rapidly drained to the lower side, and thus drainage capability is further enhanced.

According to the preferred embodiments, the surfaces of the flange portions and the end surfaces of the peripheral walls of the cover may be inclined diagonally downward at the same inclination angle, thus making it possible to advantageously lead water that tends to accumulate on the surfaces of the flange portions to the lower side and to enhance drainage capability. Also, the minute gaps formed between the opposing surfaces of the flange portions and the end surfaces of the peripheral walls of the cover may be inclined diagonally downward, and therefore, water is not likely to be drawn up to the inside of the cover by capillary action, thus making it possible to enhance water resistance.

DETAILED DESCRIPTION OF EMBODIMENTS

Hereinafter, preferred embodiments will be described with reference to the drawings.

Figure 1:
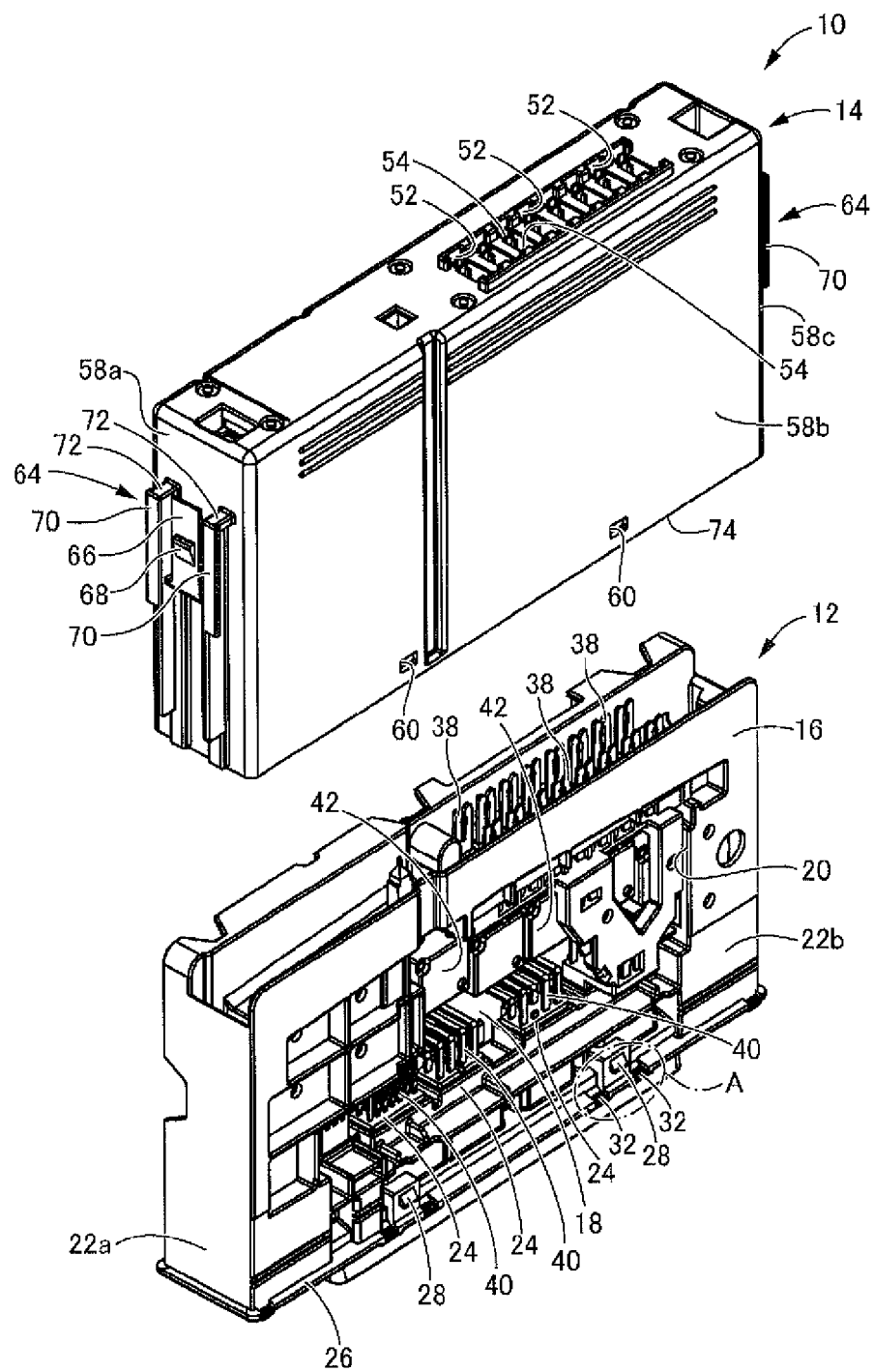
FIG. 1 is an exploded perspective view of an electrical connection box according to a preferred embodiment.

First, FIG. 1 shows an electrical connection box 10 according to a preferred embodiment. The electrical connection box 10 includes a main body portion 12 and a cover 14. The box-shaped cover 14 may be open downward and may be externally fitted from above to the main body portion 12, and thus the main body portion 12 may be accommodated in the cover 14 and assembled thereto. The electrical connection box 10 may be, for example, accommodated in another electrical connection box such as a relay box and is mounted to a vehicle such as an automobile.

Figure 2:
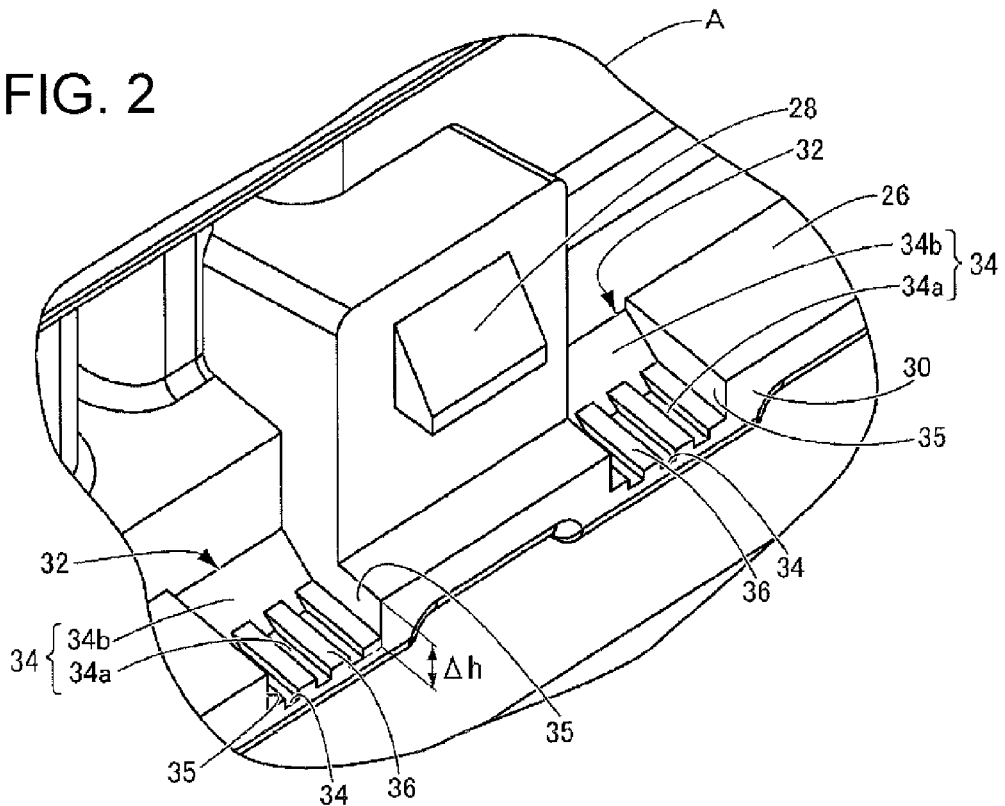
FIG. 2 is an enlarged view of region A in FIG. 1.
Figure 3:
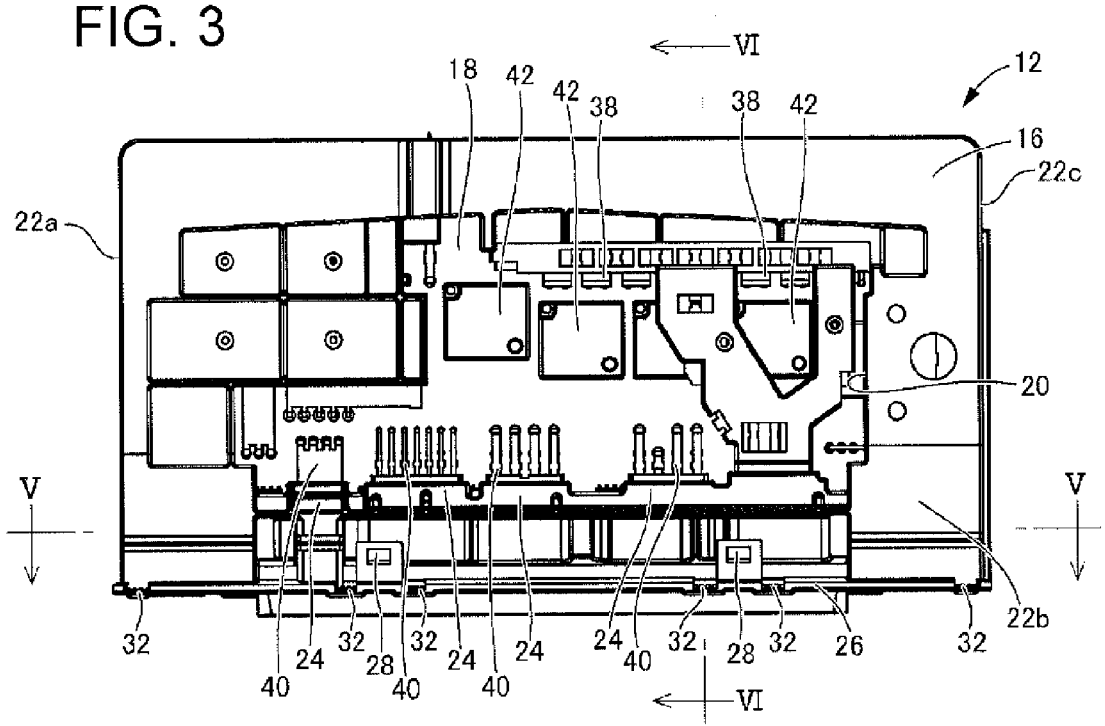
FIG. 3 is a front view of a main body portion.

FIGS. 2 to 6 show the main body portion 12. The main body portion 12 may be formed in, for example, an elongated rectangular block shape as a whole. The main body portion 12 may have a structure in which a printed circuit board 18 serving as an internal circuit is assembled to a frame body 16 made of, for example, a synthetic resin. It should be noted that the internal circuit is not limited to the printed circuit board 18, and may be configured by another conductive member such as a bus bar. The main body portion 12 may be mounted to a vehicle such that the up-down direction in FIG. 3 is the vertical up-down direction. The vertical direction in the following description refers to the vertical direction in FIG. 3.

The frame body 16 may be formed in, for example, a substantially elongated rectangular frame shape provided with a central hole 20 that penetrates the center thereof, and has four side walls 22a, 22b, 22c, and 22d. As shown in FIG. 1, fuse terminals 38, which will be described later, may be arranged in a line over substantially half of an upper surface of the frame body 16 with respect to the longitudinal direction. Moreover, a plurality of connector portions 24 through which connector terminals 40, which will be described later, are to be inserted may be formed in a line in the longitudinal direction of the frame body 16 on the lower portion of the frame body 16.

Flange portions 26 may be formed on the lower end portions of the side walls 22a, 22b, 22c, and 22d of the frame body 16 configuring the main body portion 12. As is clear from FIGS. 1, 3, and 4, the flange portions 26 project outward in a collar shape from the side walls 22a, 22b, 22c, and 22d of the frame body 16, and may be formed in a continuous manner along substantially the entire periphery of the frame body 16.

A plurality of locking claws 28 may be formed on the side wall 22b (see FIG. 3) and the side wall 22d (see FIG. 4) of the frame body 16 at positions slightly above the flange portions 26. The locking claws 28 project outward from the frame body 16. The locking claws 28 may be arranged with suitable gaps in the peripheral direction of the frame body 16. The side wall 22b of the frame body 16 may be provided with two locking claws 28, and the side wall 22d of the frame body 16 may be provided with three locking claws 28.

Figure 4:
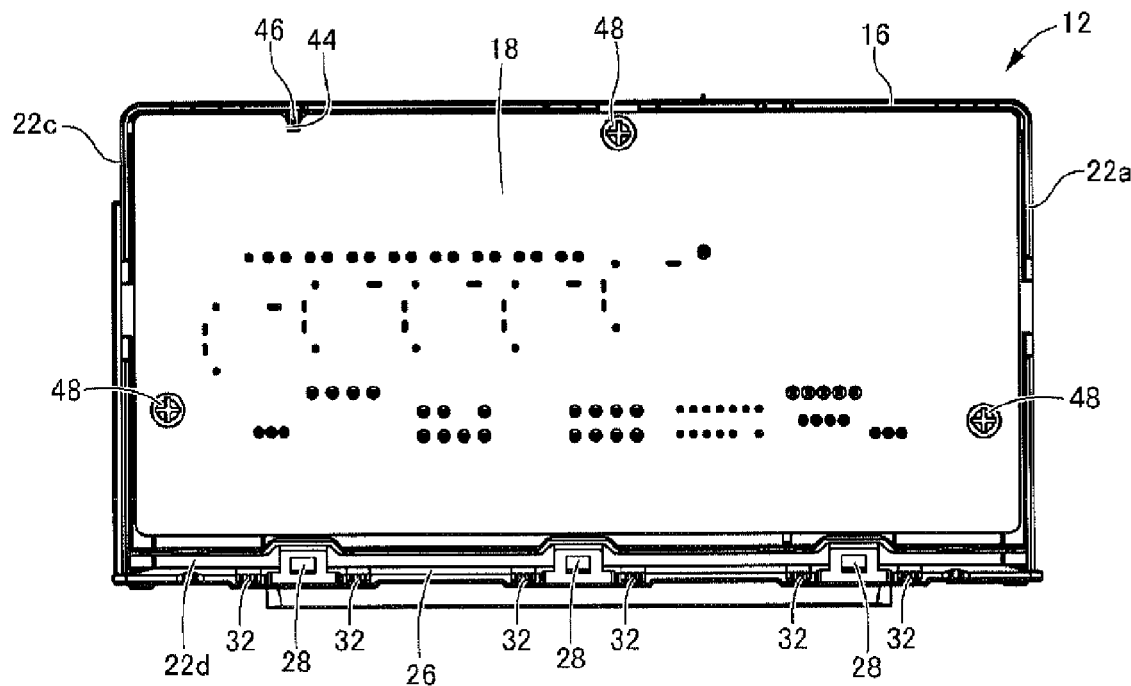
FIG. 4 is a back view of the main body portion.
Figure 5:
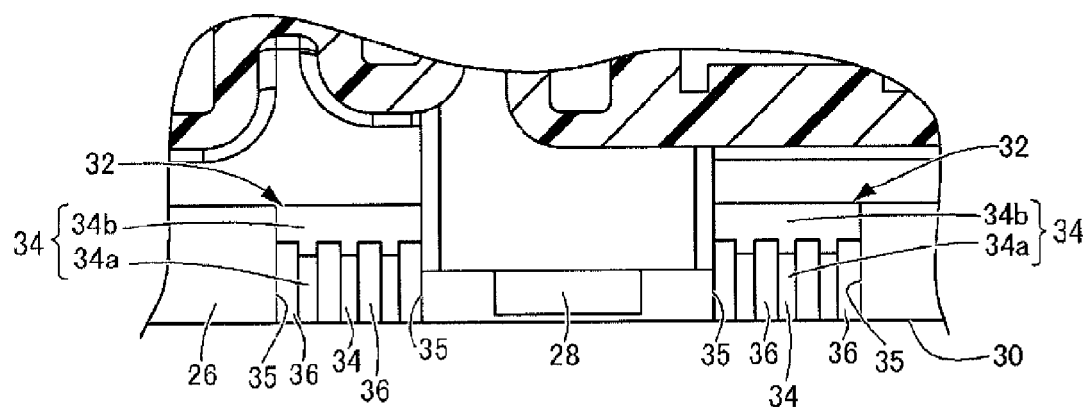
FIG. 5 is an enlarged view of main portions in a cross section taken along line V-V in FIG. 3.

Furthermore, the flange portions 26 provided on the side wall 22b and the side wall 22d of the frame body 16 may be provided with recessed portions 32 that are downward recessed portions of the surfaces of the flange portions 26 and are formed in projecting end surfaces 30 of the flange portions 26 at a plurality of positions that are separated in the peripheral direction (see FIGS. 2 and 5). In this embodiment, the flange portion 26 provided on the side wall 22b is provided with six recessed portions 32 in total, which are located at positions on the two sides of each of the two locking claws 28 and in the two end portions in the longitudinal direction (see FIG. 3). The flange portion 26 provided on the side wall 22d is provided with six recessed portions 32 in total, which are located at positions on the two sides of each of the three locking claws 28 (see FIG. 4).

Here, as shown by the enlarged views in FIGS. 2 and 5, each recessed portion 32 may be formed by cutting out part of the periphery of the flange portion 26 from the projecting end surface 30 side to form a recessed groove shape having, for example, a substantially rectangular cross section. As shown in FIG. 2, a bottom surface 34 of the recessed portion 32 is located lower than the surface of the flange portion 26 by $\Delta h$, and is connected to the surface of the flange portion 26 via two side surfaces 35 of the recessed portion 32 so as to form a step shape. It should be noted that $\Delta h$, which refers to the height difference between the surface of the flange portion 26 and the bottom surface 34 of the recessed portion 32, can be set as desired from the viewpoint of drainage capability and water resistance.

On the bottom surface 34 of the recessed portion 32, a region extending from the substantially central portion in the projection direction of the flange portion 26 to the projecting end surface 30 serves as a first region 34a in which the separation distance from the surface of the flange portion 26 to the lower side is constant, whereas a region extending from the substantially central portion in the projection direction of the flange portion 26 to a base end portion serves as a second region 34b in which the separation distance from the surface of the flange portion 26 to the lower side gradually decreases.

Figure 6:
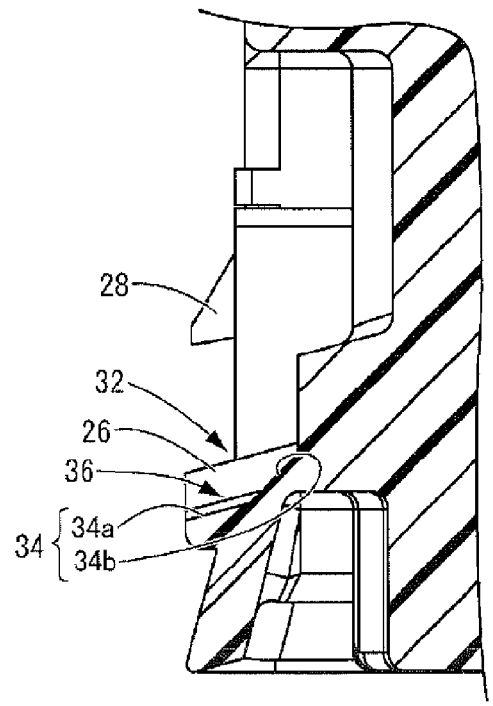
FIG. 6 is an enlarged view of main portions in a cross section taken along line VI-VI in FIG. 3.

Furthermore, as shown in FIG. 6, each flange portion 26 projects while being inclined diagonally downward at a predetermined inclination angle. The first region 34a of the bottom surface 34 of the recessed portion 32 is inclined diagonally downward at the same inclination angle as that of the flange portion 26, whereas the second region 34b of the bottom surface 34 of the recessed portion 32 is inclined diagonally downward more steeply than the flange portion 26. Thus, water entering the base end portion side of the flange portion 26 is rapidly led from the second region 34b to the first region 34a on the bottom surface 34 of the recessed portion 32 by utilizing the inclination, and drainage efficiency is enhanced.

Moreover, a plurality of (four, in this embodiment) ribs 36 projects from the bottom surface 34 of the recessed portion 32. Each of the ribs 36 may have, for example, a rectangular cross section, and may be provided so as to extend from the second region 34b toward the first region 34a on the bottom surface 34 in the projection direction of the flange portion 26. The bottom surface 34 of rise recessed portion 32 may be made rough by providing the ribs 36 to project from the bottom surface 34 in this manner. In addition, the strength of the recessed portions 32 and the entire flange portion 26 can be secured by providing the ribs 36 to project from the bottom surfaces 34 of the recessed portions 32. It should be noted that each rib 36 extends while being inclined at the same inclination angle as that of the flange portion 26 and the first region 34a of the bottom surface 34 of the recessed portion 32 (see FIG. 6).

The printed circuit board 18 may be assembled to the side wall 22d (see FIG. 4) of the frame body 16. The printed circuit board 18 may be formed in, for example, an elongated rectangular plate shape extending over substantially the entire side wall 22d of the frame body 16. The printed circuit board 18 may be provided with a plurality of fuse terminals 38 that may be connected to fuses (not shown), and a plurality of connector terminals 40 that may be connected to connectors (not shown). The fuse terminals 38 and the connector terminals 40 may be formed in, for example, an L-shaped bent shape. In addition, a plurality of relays 42 may be provided on the central portion of the printed circuit board 18.

When the printed circuit board 18 is assembled to the frame body 16, the printed circuit board 18 provided with the relays 42 and the side wall 22d of the frame body 16 overlap each other in a state where the fuse terminals 38 and the connector terminals 40 are respectively inserted through fuse terminal inserting holes (not shown) and the connector portions 24 in advance, for example. It should be noted that a notch 44 may be formed on the periphery of the printed circuit board 18 as shown in FIG. 4, and a positioning projection 46 provided on the frame body 16 enters the notch 44 to position the printed circuit board 18 with respect to the frame body 16. Thus, the fuse terminals 38 and the connector terminals 40 are respectively inserted through the corresponding through holes of the printed circuit board 18. Then, after the printed circuit board 18 is fixed to the frame body 16 with a plurality of (three, in this embodiment) bolts 48, the fuse terminals 38 and the connector terminals 40 are fixed to the printed circuit board 18 by, for example, soldering. The main body portion 12 is configured in this manner.

On the other hand, the cover 14 may be an integrally molded article made of, for example, a synthetic resin. As shown in FIG. 1, the cover 14 may be formed in, for example, an elongated rectangular box shape that is open downward. On the upper surface of the cover 14, a plurality of fuse attaching portions 52 may be formed so as to be aligned in a row over substantially half of the upper surface of the cover 14 with respect to the longitudinal direction. Each of the fuse attaching portions 52 may be provided with a pair of terminal insertion holes 54 that are opposed to each other and penetrate the upper surface of the cover 14.

Furthermore, as is clear from FIG. 1, rectangular locking holes 60 that penetrate the cover 14 may be formed at positions corresponding to the locking claws 28 of the main body portion 12 in the lower end portion of a peripheral wall 58b of the cover 14. In this embodiment, the peripheral wall 58b of the cover 14, which overlaps the side wall 22b of the frame body 16 of the main body portion 12, is provided with two locking holes 60. Similarly, although not shown in the figures, a peripheral wall 58d, which overlaps the side wall 22d of the frame body 16 of the main body portion 12, is provided with three locking holes 60.

An external lock 64 may be formed on each of the outer surfaces of peripheral walls 58a and 58c of the cover 14 that are opposed to each other in the longitudinal direction. The external locks 64 may be formed in substantially the same shape, and therefore, the external lock 64 on the peripheral wall 58a shown in FIG. 1 will be taken as an example in the following description. The external lock 64 is provided with an elastic piece 66 that projects outward from the peripheral wall 58a in the longitudinal direction of the cover 14 and extends upward. The elastic piece 66 is provided with an engaging claw 68 that projects outward in the longitudinal direction of the cover 14. Furthermore, the external lock 64 is provided with a pair of guiding portions 70 on the two sides sandwiching the elastic piece 66. The guiding portions 70 project outward from the peripheral wall 58a in the longitudinal direction of the cover 14, and extend in the vertical direction with, for example, an L-shaped cross section formed by bending the projecting edge portion away from the cover 14 at a right angle in the direction orthogonal to the longitudinal direction of the cover 14. The lower end portions of the guiding portions 70 are located slightly lower than the lower end portion of the elastic piece 66, and the upper end portions thereof are located at substantially the same height as the upper end portion of the elastic piece 66. The lower edge portions of the guiding portions 70 are open downward, and the upper edge portions of the guiding portions 70 are provided with abutting walls 72.

Figure 7:
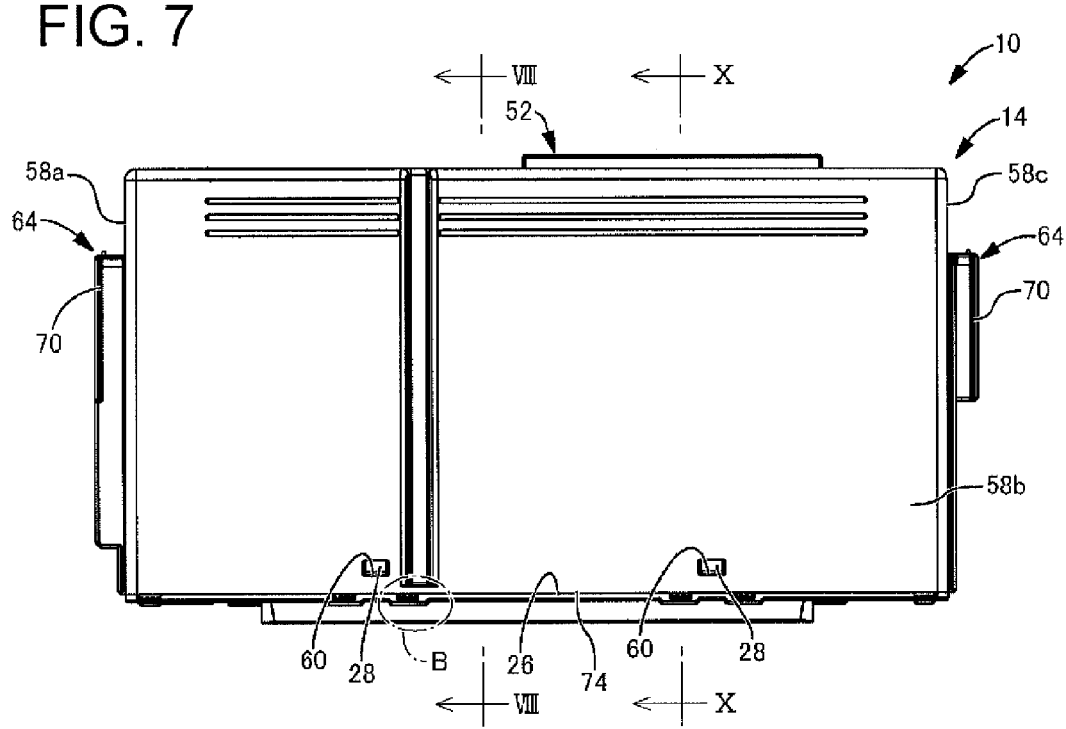
FIG. 7 is a front view illustrating a state where a cover of the electrical connection box shown in FIG. 1 and the main body portion are assembled to each other.

As shown in FIG. 1, the cover 14 may be externally fitted from above to the main body portion 12. The end surfaces 74 of the peripheral walls of the cover 14 abut against the flange portions 26 of the main body portion 12 and are held, and thus the external fitting amount of the cover 14 to the main body portion 12 is defined. Then, the locking holes 60 provided in the peripheral wall 58b of the cover 14 and the like are respectively engaged with the corresponding locking claws 28 of the main body portion 12, and thus the cover 14 is fixed to the main body portion 12. As shown in FIG. 7, the main body portion 12 and the cover 14 are thereby assembled to each other in a state where the portion of the main body portion 12 located above the flange portions 26 is accommodated in the cover 14, and thus the electrical connection box 10 is configured. Then, the fuse terminals 38 (see FIG. 1, for example) provided on the main body portion 12 are arranged in the fuse attaching portions 52 provided on the cover 14.

In the electrical connection box 10 configured to have such a structure, fuses (not shown) may be attached to the fuse attaching portions 52. The electrical connection box 10 may be accommodated in another electrical connection box (not shown) such as a relay box and may be fixed thereto via the external locks 64 provided on the cover 14, and thus each connector portion 24 may be connected to a connector provided in another electrical connection box.

Figure 8:
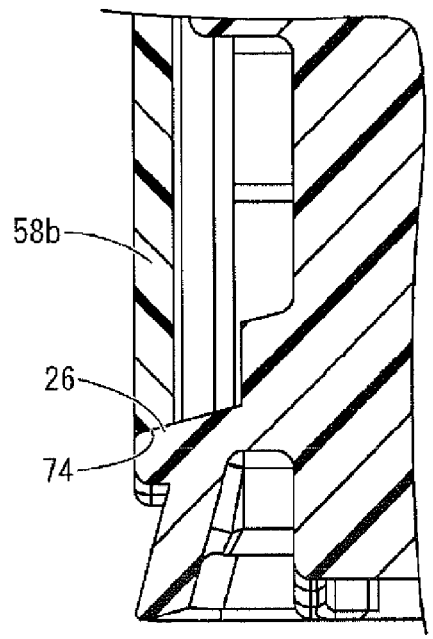
FIG. 8 is an enlarged view of main portions in a cross section taken along line VIII-VIII in FIG. 7.

In the electrical connection box 10 having the structure according to this embodiment, as shown by the enlarged view in FIG. 8, the surface of the flange portion 26 (on the upper side in FIG. 8) and the end surface 74 of the peripheral wall of the cover 14 are inclined diagonally downward at the same inclination angle. This makes it possible to advantageously lead water that tends to accumulate on the surfaces of the flange portions 26 to the lower side, while ensuring sufficient contact areas between the surfaces of the flange portions 26 and the end surfaces 74 of the peripheral walls of the cover 14 and maintaining the ability to position and hold the main body portion 12 and the cover 14. Accordingly, drainage capability at the opposing gaps between the surfaces of the flange portions 26 and the end surfaces 74 of the peripheral walls of the cover 14 is advantageously enhanced.

In addition, the minute gaps that are each formed between the opposing surfaces of the flange portions 26 and the end surfaces 74 of the peripheral walls of the cover 14 are also inclined diagonally downward, and therefore, the risk that water is drawn up to the inside of the cover 14 by capillary action is advantageously reduced. Accordingly, water resistance at the opposing gaps between the surfaces of the flange portions 26 and the end surfaces 74 of the peripheral walls of the cover 14 is also advantageously enhanced. Moreover, when water enters the cover 14 through the fuse attaching portions 52, which are open in the upper surface of the cover 14, and the like, the water is rapidly drained to the outside through the opposing gaps, which are inclined diagonally downward, between the surfaces of the flange portions 26 and the end surfaces 74 of the peripheral walls of the cover 14.

Figure 9:
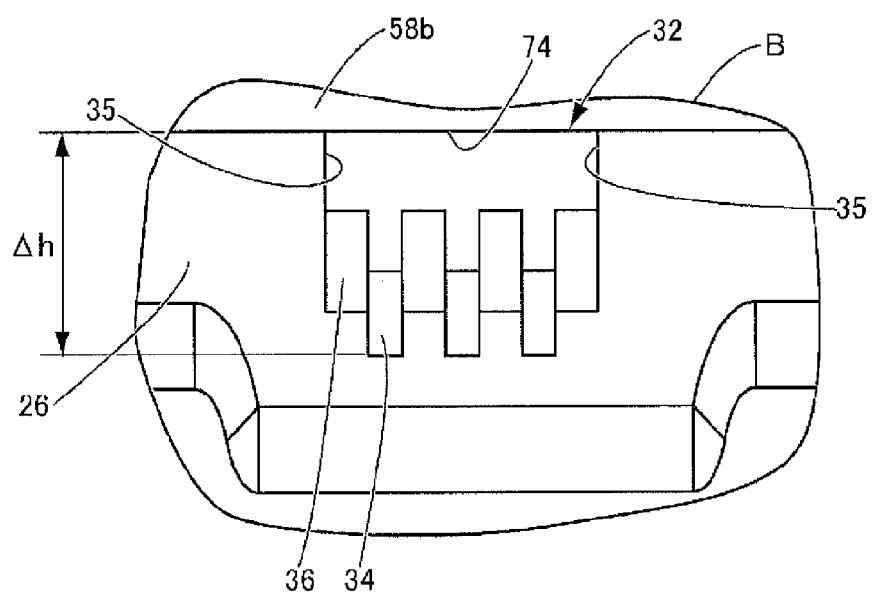
FIG. 9 is an enlarged view of region B in FIG. 7.

Here, FIG. 9 is an enlarged view of region B surrounded by the dashed-dotted line in FIG. 7. As is clear from FIG. 9, since the bottom surface 34 of the recessed portion 32 provided in the flange portion 26 is provided to be located lower than the surface of the flange portion 26 by Δh, the dimensions of the gap formed between the abutting surfaces of the flange portion 26 and the end surface 74 of the peripheral wall of the cover 14 are made larger in the region in which the recessed portion 32 is formed. Therefore, if water is sucked into the minute gaps between the surfaces of the flange portions 26 and the end surfaces 74 of the peripheral walls of the cover 14 by capillary action, surface tension is broken at the positions where the recessed portions 32 are formed, thus making it possible to rapidly lead the wafer to the recessed portions 32 connected to the end portions of the minute gaps in the peripheral direction and to reliably drain the water to the outside through the recessed portions 32.

Figure 10:
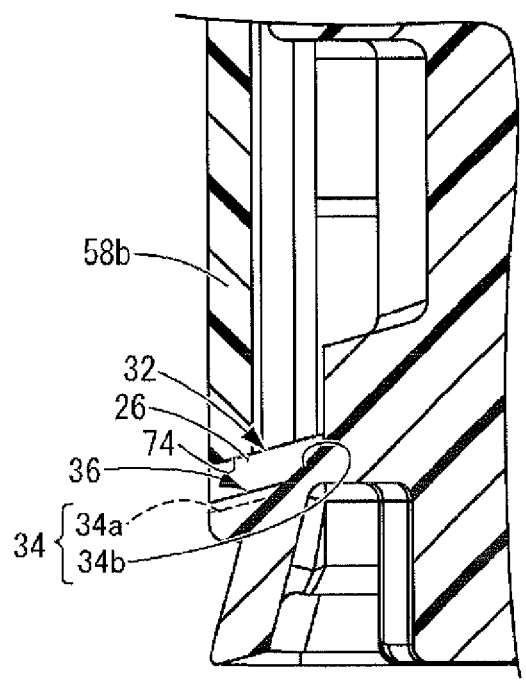
FIG. 10 is an enlarged view of main portions in a cross section taken along line X-X in FIG. 7.

Furthermore, since the bottom surfaces 34 of the recessed portion 32 are inclined diagonally downward as shown by the enlarged view in FIG. 10, the water led to the recessed portions 32 does not accumulate in the recessed portions 32 and is rapidly drained to the lower side, and thus drainage capability is further enhanced.

In addition, since the bottom surface 34 of the recessed portion 32 may be made rough by the ribs 36 projecting from the bottom surface 34, the problem in which a hole-shaped region defined by the bottom surface 34 of the recessed portion 32, the side surfaces 35, and the end surface 74 of the peripheral wall of the cover 14 is blocked by the surface tension of water when water flows into the hole-shaped region is advantageously solved when water is drained from the recessed portion 32 to the outside.

Since the ribs 36 projecting from the bottom surface 34 of the recessed portion 32 extend hi the projection direction of the flange portion 26 in this embodiment, water led to the recessed portion 32 is reliably led to the outside of the flange portion 26 along the ribs 36, and thus drainage capability is further enhanced.

Since the flange portion 26 is provided with the recessed portions 32 on the two sides of the locking claw 28 in this embodiment, it is possible to rapidly lead water entering the cover 14 from the locking hole 60 that penetrates the peripheral wall 58b of the cover 14 and is engaged with the locking claw 28 to the recessed portion 32 and drain the water to the outside.

Although preferred embodiments have been described in detail, the present invention is not limited to the embodiments discussed herein. For example, it is sufficient that at least the surface of the flange portion 26 is inclined at the same inclination angle as the end surface 74 of the peripheral wall of the cover 14, and it is possible to form the bottom surface (on the lower side in FIG. 8) of the flange portion 26 at a desired inclination angle, for example, so as to project in the horizontal direction.

The bottom surface 34 of the recessed portion 32 need not be inclined at the same inclination angle as the surface of the flange portion 26, and may be inclined diagonally downward at a different angle from that of the surface of the flange portion 26 in a portion or the entire region of the bottom surface 34 of the recessed portion 32.

Although the example in which the flange portions 26 project from the frame body 16 of the main body portion 12 is shown in the foregoing embodiment, it goes without saying that the present invention can be carried out by providing the flange portions 26 to project from a cover on the lower side in the case where the cover on the lower side is attached to the main body portion 12 from below.

It should be noted that the number and the positions of the recessed portions 32 provided in the flange portion 26, the number and the shape of the ribs 36 provided in the recessed portion 32, and the like can be set as desired considering the individual circumstances from the viewpoint of drainage capability and water resistance.

The invention claimed is:
1. An electrical connection box comprising:
a main body portion including an internal circuit; and
a cover having a box shape open downward and externally fitted from above to the main body portion, the cover having a peripheral wall with an end surface arranged to abut against a flange portion of the main body portion,
the flange portion projecting outward in a collar shape from a side wall of the main body portion,
a surface of the flange portion of the main body portion and the end surface of the peripheral wall of the cover being inclined diagonally downward at the same inclination angle,
the flange portion being provided with a recessed portion formed recessed relative to the surface of the flange portion and formed in a projecting end surface of the flange portion, and
a bottom surface of the recessed portion being inclined diagonally downward.
2. The electrical connection box according to claim 1, wherein
the bottom surface of the recessed portion is connected to the surface of the flange portion by a vertically extending side surface defining a height difference between the bottom surface of the recessed portion and the surface of the flange portion.

3. The electrical connection box according to claim 1, wherein the bottom surface of the recessed portion is inclined at the same inclination angle as the surface of the flange portion.

4. The electrical connection box according to claim 1, wherein the bottom surface includes a first region and a second region, the first region being inclined at the same inclination angle as the surface of the flange portion, the second region being inclined at a different inclination angle from the surface of the flange portion.

5. The electrical connection box according to claim 4, wherein the second region is disposed above the first region.

6. The electrical connection box according to claim 4, wherein the first region of the bottom surface is provided with a plurality of ribs projecting from the first region and extending between the first and second regions.

7. The electrical connection box according to claim 6, wherein each of the plurality of ribs has an upper surface inclined at the same inclination angle as the surface of the flange portion.

8. The electrical connection box according to claim 4, wherein the end surface of the peripheral wall of the cover is spaced from the flange portion of the main body portion by a first distance at a location of the first region of the bottom surface of the recessed portion, the end surface of the peripheral wall of the cover is spaced from the flange portion of the main body portion by a second distance at a location of the second region of the bottom surface of the recessed portion, and the end surface of the peripheral wall of the cover is spaced from the flange portion of the main body portion by a third distance at a location away from the recessed portion, the first distance being greater than the second distance, and the second distance being greater than the third distance.

9. The electrical connection box according to claim 1, wherein the end surface of the peripheral wall of the cover is spaced from the flange portion of the main body portion by a first distance at a location of the recessed portion, and the end surface of the peripheral wall of the cover is spaced from the flange portion of the main body portion by a second distance at a location away from the recessed portion, the first distance being greater than the second distance.

* * * * *